United States Patent
Weng et al.

(10) Patent No.: US 11,121,720 B2
(45) Date of Patent: Sep. 14, 2021

(54) ANALOG-TO-DIGITAL CONVERTER HAVING QUANTIZATION ERROR DUPLICATE MECHANISM

(71) Applicant: MEDIATEK INC., Hsin-Chu (TW)

(72) Inventors: Chan-Hsiang Weng, Hsinchu (TW); Hung-Yi Hsieh, Hsinchu (TW); Tzu-An Wei, Hsinchu (TW); Ting-Yang Wang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/934,002

(22) Filed: Jul. 20, 2020

(65) Prior Publication Data

US 2021/0044301 A1    Feb. 11, 2021

Related U.S. Application Data

(60) Provisional application No. 62/883,693, filed on Aug. 7, 2019.

(51) Int. Cl.
  *H03M 1/80*    (2006.01)
  *H03M 1/06*    (2006.01)
  (Continued)

(52) U.S. Cl.
  CPC ......... *H03M 1/802* (2013.01); *H03M 1/0656* (2013.01); *H03M 1/0854* (2013.01); *H03M 1/121* (2013.01); *H03M 1/38* (2013.01)

(58) Field of Classification Search
  CPC .. H03M 1/802; H03M 1/0656; H03M 1/0854; H03M 1/121; H03M 1/38; H03M 1/662; H03M 1/426

(Continued)

(56) References Cited

U.S. PATENT DOCUMENTS 4,764,753 A * 8/1988 Yukawa ................ H03M 1/462
                                                    341/155
6,163,290 A * 12/2000 Moreland ........... H03F 3/45071
                                                    341/155

(Continued)

FOREIGN PATENT DOCUMENTS

CN        104135291 A      11/2014

OTHER PUBLICATIONS

Bo Wu ,"A 24.7 mW 65 nm CMOS SAR-Assisted CT delta-sigma Modulator With Second-Order Noise Coupling Achieving 45 MHz Bandwidth and 75.3 dB SNDR", IEEE Journal of Solid-State Circuits, vol. 51, No. 12, Dec. 2016.

(Continued)

*Primary Examiner* — Lam T Mai
(74) *Attorney, Agent, or Firm* — Winston Hsu

(57) ABSTRACT

The present invention provides an ADC including a first switched capacitor array, a second switched capacitor array, a third switched capacitor array, an integrator and a quantizer. The first switched capacitor array is configured to sample the input signal to generate a first sampled signal. The second switched capacitor array is configured to sample the input signal to generate a second sampled signal and generate a first quantization error. The third switched capacitor array is configured to sample the input signal to generate a third sampled signal and generate a second quantization error. The integrator is configured to receive the first quantization error and the second quantization error in a time-interleaving manner, and integrate the first/second quantization error to generate an integrated quantization error. The quantizer is configured to quantize the first sampled signal by using the integrated quantization error as a reference voltage to generate a digital output signal.

10 Claims, 3 Drawing Sheets

(51) Int. Cl.
  *H03M 1/08* (2006.01)
  *H03M 1/12* (2006.01)
  *H03M 1/38* (2006.01)

(58) Field of Classification Search
  USPC .................................................. 341/140–160
  See application file for complete search history.

(56) References Cited

U.S. PATENT DOCUMENTS

| | | | | |
|---|---|---|---|---|
| 6,563,235 | B1* | 5/2003 | McIntyre | H02M 3/07 |
| | | | | 307/109 |
| 7,271,750 | B1* | 9/2007 | Ali | H03M 1/1019 |
| | | | | 341/118 |
| 7,405,679 | B1* | 7/2008 | Widmer | H03M 7/20 |
| | | | | 341/102 |
| 8,314,653 | B1* | 11/2012 | Granger-Jones | H03F 1/56 |
| | | | | 327/553 |
| 2006/0187106 | A1 | 8/2006 | Mitra | |
| 2012/0081022 | A1* | 4/2012 | Moussakov | H05B 45/44 |
| | | | | 315/240 |
| 2017/0317683 | A1 | 11/2017 | Bandyopadhyay | |

OTHER PUBLICATIONS

Koji Obata ,"A 97.99 dB SNDR, 2 kHz BW, 37.1 uW Noise-Shaping SAR ADC with Dynamic Element Matching and Modulation Dither Effect", 2016 Symposium on VLSI Circuits Digest of Technical Papers.

* cited by examiner

ANALOG-TO-DIGITAL CONVERTER HAVING QUANTIZATION ERROR DUPLICATE MECHANISM

CROSS REFERENCE TO RELATED APPLICATIONS

This application claims the priority of U.S. Provisional Application No. 62/883,693, filed on Aug. 7, 2019, which is included herein by reference in its entirety.

BACKGROUND

In a noise-shaping analog-to-digital converter (ADC), the ADC usually needs additional phase to sample and integrate quantization error for the following cycle. For example, after a switched capacitor array sample an input signal and a quantizer quantizes the sampled input signal to generate a digital output signal, the quantization error exists on the switched capacity array. Then, an additional buffer and an integrator of the ADC sample and integrate quantization error to generate the integrated quantization error for a next cycle of the quantizer. During the generation of the integrated quantization error, the switched capacitor array and the quantizer will stop working to avoid affecting the operation of the integrator, but this will reduce the operation speed of the ADC.

SUMMARY

It is therefore an objective of the present invention to provide an ADC, which uses two additional switched capacitor arrays to duplicate the quantization error, and the two additional switched capacitor arrays operate alternatively to increase the operation speed to the ADC, to solve the above-mentioned problems.

The present invention provides an ADC comprising a first switched capacitor array, a second switched capacitor array, a third switched capacitor array, an integrator and a quantizer. The first switched capacitor array is configured to receive an input signal and sample the input signal to generate a first sampled signal. The second switched capacitor array is configured to sample the input signal to generate a second sampled signal and generate a first quantization error. The third switched capacitor array is configured to sample the input signal to generate a third sampled signal and generate a second quantization error. The integrator is configured to receive the first quantization error and the second quantization error in a time-interleaving manner, and integrate the first/second quantization error to generate an integrated quantization error. The quantizer is configured to quantize the first sampled signal by using the integrated quantization error as a reference voltage to generate a digital output signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
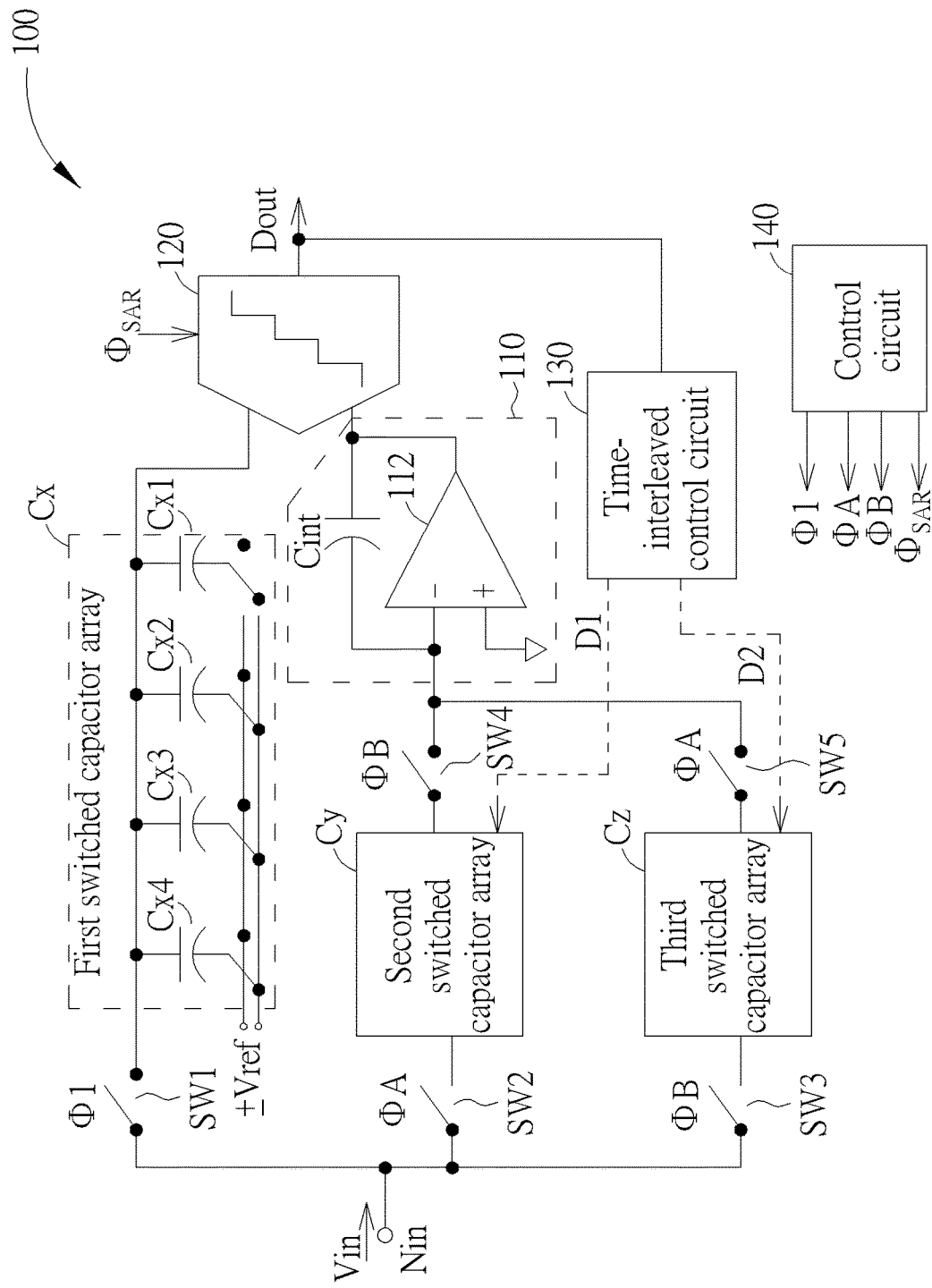
FIG. 1 is a diagram illustrating an ADC according to one embodiment of the present invention.

FIG. 1 is a diagram illustrating an ADC 100 according to one embodiment of the present invention. As shown in FIG. 1, the ADC 100 is a successive-approximation-register (SAR) ADC, and the ADC 100 comprises a first switched capacitor array Cx, a second switched capacitor array Cy, a third switched capacitor array Cz, an integrator 110, a quzntizer 210, a time-interleaved control circuit 130, a control circuit 140 and a switching circuit. In this embodiment, the first switched capacitor array Cx comprises a plurality of capacitors and switches (in this embodiment, there are four capacitors Cx1-Cx4), and one terminal of each capacitor is connected to a top plate, and the other terminal of each capacitor is connected to a positive reference voltage +Vref or a negative reference voltage −Vref via the corresponding switch. The integrator 110 may comprise an operational amplifier 112 and a feedback capacitor Cint. The switching circuit comprises five switches SW1-SW5, wherein the switch SW1 is coupled between an input terminal Nin of the ADC 100 and the first switched capacitor array Cx, the switch SW2 is coupled between the input terminal Nin and the second switched capacitor array Cy, the switch SW3 is coupled between the input terminal Nin and the third switched capacitor array Cz, the switch SW4 is coupled between the second switched capacitor array Cy and the integrator 110, and the switch SW5 is coupled between the third switched capacitor array Cz and the integrator 110.

In this embodiment, the second switched capacitor array Cy and the third switched capacitor array Cz may be designed to have similar structure of the first switched capacitor array Cx (not a limitation of the present invention). For example, the second switched capacitor array Cy may also comprise four capacitors, one terminal of each capacitor is connected to a plate, and the other terminal of each capacitor is coupled to the positive reference voltage +Vref or the negative reference voltage −Vref via the corresponding switch.

Figure 2:
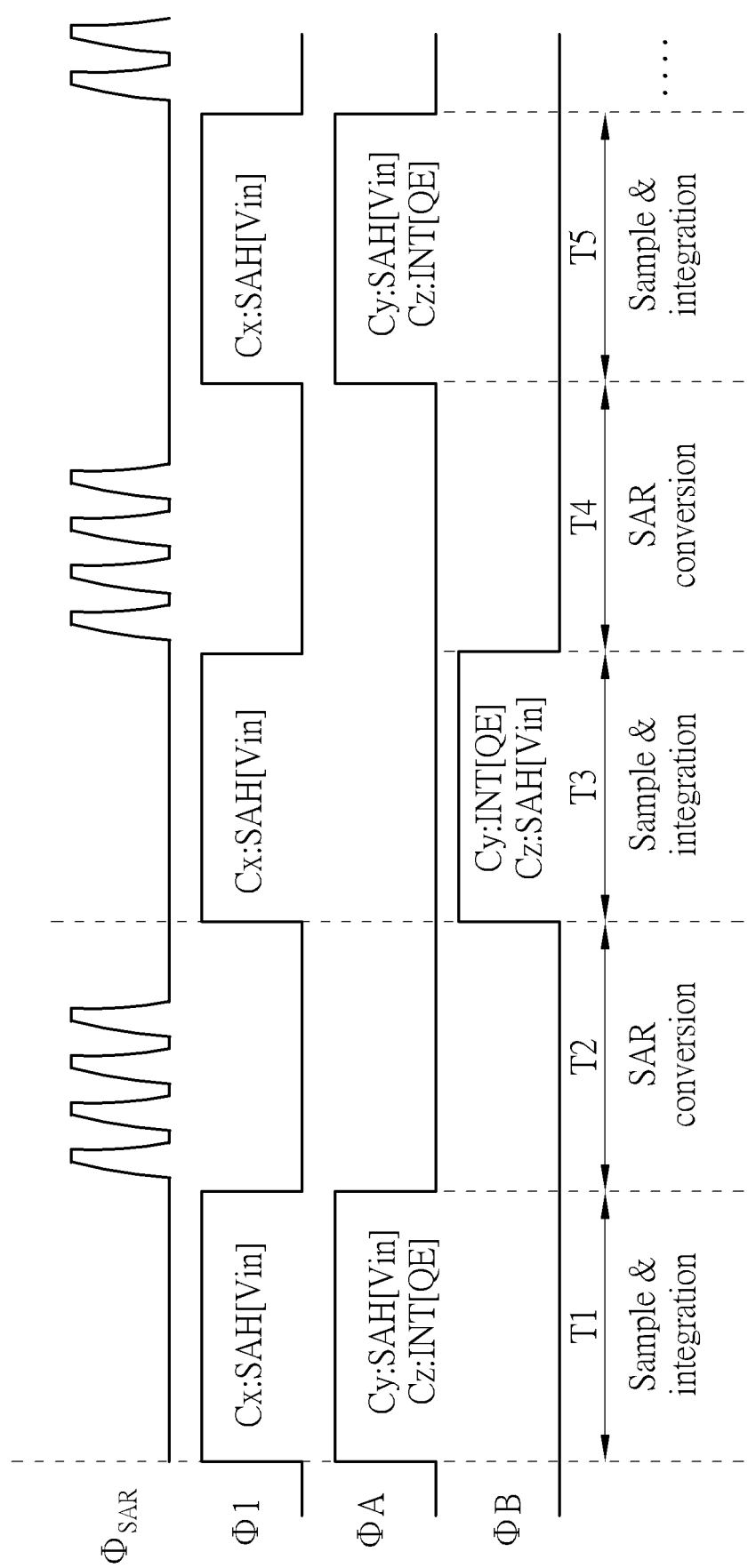
FIG. 2 shows a timing diagram of the ADC according to one embodiment of the present invention.

FIG. 2 shows a timing diagram of the ADC 100 according to one embodiment of the present invention. Refer to FIG. 1 and FIG. 2 together, each cycle of the ADC 100 comprises a sampling phase and a quantization phase. In a first sampling phase of the ADC 100 (i.e. a period T1 shown in FIG. 2), the control circuit 140 generates a control signal Φ1 to enable the switch SW1 to allow the first switched capacitor array Cx to receive an input signal Vin to generate a first sampled signal at the top plate, the control circuit 140 generates a control signal ΦA to enable switch SW2 to allow the second switched capacitor array Cy to receive the input signal Vin to generate the second sampled signal, the control circuit 140 generates a control signal ΦB to disable switch SW3 to disconnect the third switched capacitor array Cz from the input terminal Nin, that is the third switched capacitor array Cz does not receive the input signal Vin. In addition, during the period T1, the control signal ΦA enables the switch SW5 to connect the third switched capacitor array Cz to the integrator 110, that is the feedback capacitor Cint of the integrator 110 and the third switched capacitor array Cz have a charge-sharing operation, and is a quantization error in the third switched capacitor array Cz is sent to the integrator 110, and the integrator 110 integrates the received quantization error to generate an integrated quantization error. In addition, the control signal ΦB disables the switch SW4 to disconnect the third switched capacitor array Cy from the integrator 110.

In the first sampling phase (i.e. the period T1) of the ADC 100, the first switched capacitor array Cx and the second switched capacitor array Cy sample the input signal Vin concurrently, and the integrator 110 integrates the quantization error from the third switched capacitor array Cz. In addition, at this time, the time-interleaved control circuit 130 does not generate any control signal to control the switches within the second switched capacitor array Cy and the third switched capacitor array Cz.

In a first quantization phase of the ADC 100 (i.e. a period T2 shown in FIG. 2), all of the switches SW1-SW5 are disabled, that is the first switched capacitor array Cx, the second switched capacitor array Cy and the third switched capacitor array Cz does not receive and sample the input signal Vin, and the integrator 110 does not receive the quantization error from the second switched capacitor array Cy and the third switched capacitor array Cz, that is the integrator 110 provides a stable integrated quantization error to the quantizer 120. The control circuit 140 generates a control signal $\Phi_{SAR}$ to enable the quantizer 120 to perform SAR conversion to quantize the first sampled signal generated by the first switched capacitor array Cx by using the integrated quantization error, to generate a digital output signal Dout. For example, the integrated quantization error outputted by the integrator 110 serves as a reference voltage, and the quantizer 120 compares the first sampled signal with the reference voltage (i.e. integrated quantization error) to generate the digital output signal Dout. In this embodiment, the quantizer 120 sequentially generates four bits serving the as the digital output signal Dout. The digital output signal Dout is further used to control the switches of the first switched capacitor array Cx, and after the switches are controlled to connect the capacitors Cx1-Cx4 to the positive reference voltage +Vref or the negative reference voltage −Vref, a voltage at the top plate of the first switched capacitor array Cx can be regarded as the quantization error. It is noted that because using the digital output signal Dout to control the switches within the first switched capacitor array Cx is known by a person skilled in the art, and the embodiment of the present invention does not focus on the internal control of the first switched capacitor array Cx, detailed descriptions about the first switched capacitor array Cx are omitted here.

In the period T2, the time-interleaved control circuit 130 generates a control signal D1 to the second switch capacitor array Cy to make the second switch capacitor array Cy generate a first quantization error, wherein the first quantization error is a duplicate of the quantization error of the first switched capacitor array Cx. For example, if the second switched capacitor array Cy has the same structure as the first switched capacitor array Cx, the digital output signal Dout can serve as the control signal D1, that is the switches of the second switched capacitor array Cy and the first switched capacitor array Cx are controlled by the same method. In addition, at this time, the third switched capacitor array Cz does not work, and the time-interleaved control circuit 130 does not generate any control signal to the third switched capacitor array Cz.

Because the first quantization error generated by the second switch capacitor array Cy in the period T2 is the duplicate the quantization error of the first switched capacitor array Cx, the first quantization error generated by the second switch capacitor array Cy can be sent to the integrator 110 for generating the integrated quantization error in the next cycle, and the quantization error of the first switched capacitor array Cx is not required for the integrator 110. Therefore, the first switched capacitor array Cx can immediately enter a next sampling phase, without wasting time for sending its quantization error to the integrator 110.

In a second sampling phase of the ADC 100 (i.e. a period T3 shown in FIG. 2), the control circuit 140 generates the control signal Φ1 to enable the switch SW1 to allow the first switched capacitor array Cx to receive the input signal Vin to generate the first sampled signal at the top plate, the control circuit 140 generates the control signal ΦB to enable switch SW3 to allow the third switched capacitor array Cz to receive the input signal Vin to generate a third sampled signal, the control circuit 140 generates a control signal ΦA to disable switch SW2 to disconnect the second switched capacitor array Cy from the input terminal Nin, that is the second switched capacitor array Cy does not receive the input signal Vin. In addition, during the period T3, the control signal ΦB enables the switch SW4 to connect the second switched capacitor array Cy to the integrator 110, that is the feedback capacitor Cint of the integrator 110 and the second switched capacitor array Cy have a charge-sharing operation, and the first quantization error in the second switched capacitor array Cy is sent to the integrator 110, and the integrator 110 integrates the received quantization error to generate the integrated quantization error.

In the second sampling phase (i.e. the period T3) of the ADC 100, the first switched capacitor array Cx and the third switched capacitor array Cz sample the input signal Vin concurrently, and the integrator 110 integrates the quantization error from the second switched capacitor array Cy. In addition, at this time, the time-interleaved control circuit 130 does not generate any control signal to control the switches within the second switched capacitor array Cy and the third switched capacitor array Cz.

In a second quantization phase of the ADC 100 (i.e. a period T4 shown in FIG. 2), all of the switches SW1-SW5 are disabled, that is the first switched capacitor array Cx, the second switched capacitor array Cy and the third switched capacitor array Cz does not receive and sample the input signal Vin, and the integrator 110 does not receive the quantization error from the second switched capacitor array Cy and the third switched capacitor array Cz, that is the integrator 110 provides a stable integrated quantization error to the quantizer 120. The control circuit 140 generates the control signal $\Phi_{SAR}$ to enable the quantizer 120 to quantize the first sampled signal generated by the first switched capacitor array Cx by using the integrated quantization error, to generate a digital output signal Dout. For example, the integrated quantization error outputted by the integrator 110 serves as the reference voltage, and the quantizer 120 compares the first sampled signal with the reference voltage (i.e. integrated quantization error) to generate the digital output signal Dout. In this embodiment, the quantizer 120 sequentially generates four bits serving the as the digital output signal Dout. The digital output signal Dout is further used to control the switches of the first switched capacitor array Cx, and after the switches are controlled to connect the capacitors Cx1-Cx4 to the positive reference voltage +Vref or the negative reference voltage −Vref, the voltage at the top plate of the first switched capacitor array Cx can be regarded as the quantization error.

In the period T4, the time-interleaved control circuit 130 generates a control signal D2 to the third switch capacitor array Cz to make the third switch capacitor array Cz generate a second quantization error, wherein the second quantization error is a duplicate of the quantization error of the first switched capacitor array Cx. For example, if the third switched capacitor array Cz has the same structure as the first switched capacitor array Cx, the digital output signal Dout can serve as the control signal D2, that is the switches of the third switched capacitor array Cz and the first switched capacitor array Cx are controlled by the same method. In addition, at this time, the second switched capacitor array Cy does not work, and the time-interleaved control circuit 130 does not generate any control signal to the second switched capacitor array Cy.

Because the second quantization error generated by the third switch capacitor array Cz in the period T4 is the duplicate the quantization error of the first switched capacitor array Cx, the second quantization error generated by the third switch capacitor array Cz can be sent to the integrator 110 for generating the integrated quantization error in the next cycle, and the quantization error of the first switched capacitor array Cx is not required for the integrator 110. Therefore, the first switched capacitor array Cx can immediately enter a next sampling phase, without wasting time for sending its quantization error to the integrator 110.

The above-mentioned operations of first sampling phase, first quantization phase, second sampling phase and second quantization phase can be repeatedly executed in the following cycles. That is the ADC 110 can operate in third sampling phase (e.g. period T5 shown in FIG. 2), third quantization phase, fourth sampling phase and fourth quantization phase in sequence, and operations of third sampling phase, third quantization phase, fourth sampling phase and fourth quantization phase are the same as the operations of first sampling phase, first quantization phase, second sampling phase and second quantization phase.

Referring to the above descriptions, because one of the second switched capacitor array Cy and the third switched capacitor array Cz is used to generate duplicate quantization error, the second switched capacitor array Cy and the third switched capacitor array Cz are controlled to alternately operate for the sampling operation and quantization error integration operation, and the sampling operation and the quantization error integration operation operate concurrently in the sampling phase of the ADC, the operation speed of the ADC 100 can be increased because the quantization error of the first switched capacitor array Cx does not need for the quantization error integration.

Figure 3:
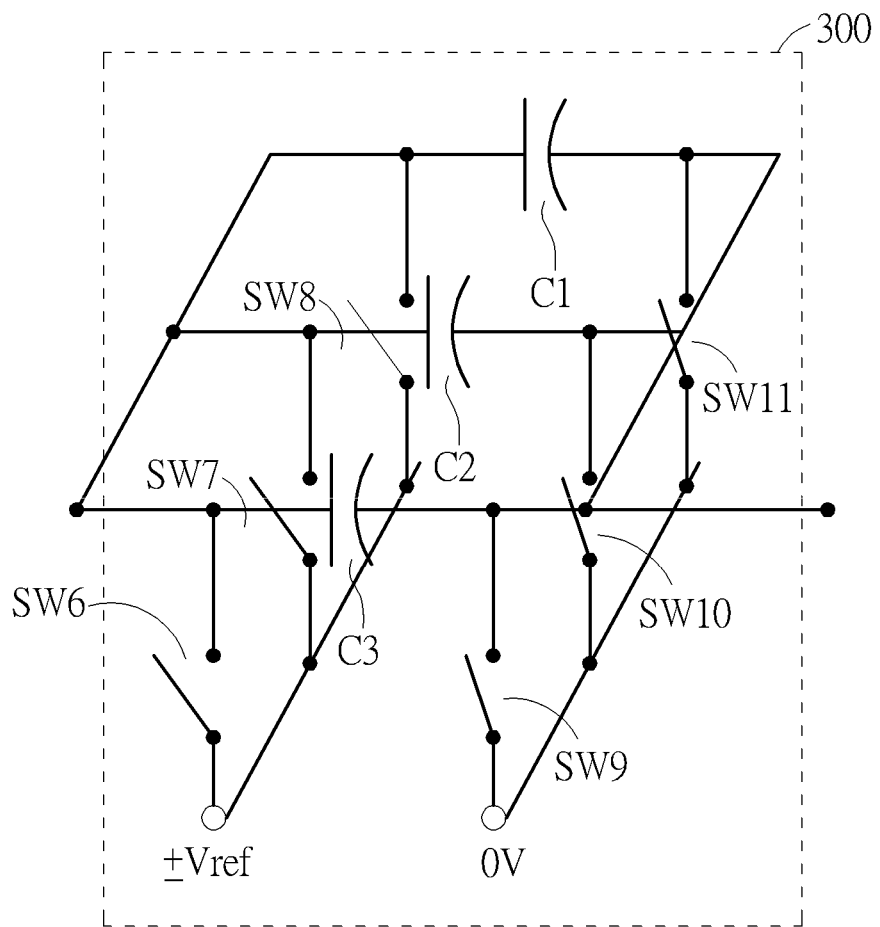
FIG. 3 is a diagram illustrating a switched capacitor array according to one embodiment of the present invention.

It is noted that the second switched capacitor array Cy or the third switched capacitor array Cz does not have to have the same circuit structure as the first switched capacitor array Cx. As long as the second switched capacitor array Cy and the third switched capacitor array Cz can generate the duplicate quantization error of the first switched capacitor array Cx, the second switched capacitor array Cy or the third switched capacitor array Cz may have any other suitable structure such as a switched capacitor array 300 shown in FIG. 3. The switched capacitor array 300 comprises capacitors C1-C3 and six switches SW6-SW11, where one terminal of the capacitors C1-C3 are coupled to the positive reference voltage +Vref or the negative reference voltage −Vref via the switches SW6-SW8, respectively, and the other terminal of the capacitors C1-C3 are coupled to a reference voltage such as 0V via the switches SW9-SW11, respectively, wherein the switches SW6-SW11 are controlled by the control signal D1/D2 outputted by the time-interleaved control circuit 130.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An analog-to-digital converter (ADC), comprising:
  a first switched capacitor array, configured to receive an input signal and sample the input signal to generate a first sampled signal;
  a second switched capacitor array, configured to sample the input signal to generate a second sampled signal and generate a first quantization error;
  a third switched capacitor array, configured to sample the input signal to generate a third sampled signal and generate a second quantization error;
  an integrator, coupled to the second switched capacitor array and the third switched capacitor array, configured to receive the first quantization error and the second quantization error in a time-interleaving manner, and integrate the first/second quantization error to generate an integrated quantization error; and
  a quantizer, coupled to the first switched capacitor array and the integrator, configured to quantize the first sampled signal by using the integrated quantization error as a reference voltage to generate a digital output signal.

2. The ADC of claim 1, wherein the ADC operates alternately in a sampling phase and a quantization phase; and when the ADC operates in the sampling phase, the first switched capacitor array samples the input signal to generate the first sampled signal, one of the second switched capacitor array and the third switched capacitor array samples the input signal to generate the second/third sampled signal, and the other one of the second switched capacitor array and the third switched capacitor array sends the first/second quantization error to the integrator.

3. The ADC of claim 2, wherein when the ADC operates in the quantization phase, the quantizer quantizes the first sampled signal by using the integrated quantization error to generate the digital output signal, and only one of the second switched capacitor array and the third switched capacitor array are controlled according to the digital output signal to generate the first/second quantization error.

4. The ADC of claim 1, wherein the ADC operates in a first sampling phase, a first quantization phase, a second sampling phase and a second quantization phase in sequence; and when the ADC operates in the first sampling phase, the first switched capacitor array samples the input signal to generate the first sampled signal, the second switched capacitor array samples the input signal to generate the second sampled signal, and the third switched capacitor array sends the second quantization error to the integrator; when the ADC operates in the first quantization phase, the quantizer quantizes the first sampled signal by using the integrated quantization error to generate the digital output signal, and the second switched capacitor array is controlled according to the digital output signal to generate the first quantization error; when the ADC operates in the second sampling phase, the first switched capacitor array samples the input signal to generate the first sampled signal, the third switched capacitor array samples the input signal to generate the third sampled signal, and the second switched capacitor array sends the first quantization error to the integrator; and when the ADC operates in the second quantization phase, the quantizer quantizes the first sampled signal by using the integrated quantization error to generate the digital output signal, and the third switched capacitor array is controlled according to the digital output signal to generate the second quantization error.

5. The ADC of claim 1, further comprising:
a switching circuit, configured to selectively connect the input signal to the first switched capacitor array, the second switched capacitor array and the third switched capacitor array, and selectively connect the second switched capacitor array and the third switched capacitor array to the integrator.

6. The ADC of claim 5, wherein the switching circuit comprises:
a first switch, coupled between the input signal and the first switched capacitor array;
a second switch, coupled between the input signal and the second switched capacitor array;
a third switch, coupled between the input signal and the third switched capacitor array;
a fourth switch, coupled between second switched capacitor array and the integrator; and
a fifth switch, coupled between third switched capacitor array and the integrator.

7. The ADC of claim 6, wherein the ADC operates in a first sampling phase, a first quantization phase, a second sampling phase and a second quantization phase in sequence; and when the ADC operates in the first sampling phase, the first switch, the second switch and the fifth switch are enabled, and the third switch and the fourth switch are disabled; when the ADC operates in the first quantization phase, the first switch, the second switch, the third switch, the fourth switch and the fifth switch are disabled; when the ADC operates in the second sampling phase, the first switch, the third switch and the fourth switch are enabled, and the second switch and the fifth switch are disabled; and when the ADC operates in the second quantization phase, the first switch, the second switch, the third switch, the fourth switch and the fifth switch are disabled.

8. The ADC of claim 7, wherein when the ADC operates in the first sampling phase, the first switched capacitor array samples the input signal to generate the first sampled signal, the second switched capacitor array samples the input signal to generate the second sampled signal, and the third switched capacitor array sends the second quantization error to the integrator; when the ADC operates in the first quantization phase, the quantizer quantizes the first sampled signal by using the integrated quantization error to generate the digital output signal, and the second switched capacitor array is controlled according to the digital output signal to generate the first quantization error; when the ADC operates in the second sampling phase, the first switched capacitor array samples the input signal to generate the first sampled signal, the third switched capacitor array samples the input signal to generate the third sampled signal, and the second switched capacitor array sends the first quantization error to the integrator; and when the ADC operates in the second quantization phase, the quantizer quantizes the first sampled signal by using the integrated quantization error to generate the digital output signal, and the third switched capacitor array is controlled according to the digital output signal to generate the second quantization error.

9. The ADC of claim 1, wherein a quantization error generated in the first switched capacitor array does not send to the integrator for generating the integrated quantization error.

10. The ADC of claim 1, wherein the ADC is a successive-approximation-register (SAR) ADC.

* * * * *